United States Patent
Ohkuni et al.

(10) Patent No.: US 7,494,827 B2
(45) Date of Patent: Feb. 24, 2009

(54) PLASMA ETCHING METHOD AND PLASMA ETCHING APPARATUS

(75) Inventors: Mitsuhiro Ohkuni, Nara (JP); Keiichi Matsunaga, Toyama (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 11/471,700

(22) Filed: Jun. 21, 2006

(65) Prior Publication Data

US 2006/0286806 A1     Dec. 21, 2006

(30) Foreign Application Priority Data

Jun. 21, 2005     (JP) ............................. 2005-180739

(51) Int. Cl.
*H01L 21/00*     (2006.01)
(52) U.S. Cl. ...................... 438/9; 438/513; 257/E21.17; 257/E21.218; 257/E21.229; 257/E21.245
(58) Field of Classification Search ...................... 438/9, 438/311, 513, 679, 680, 706, 710, 905
See application file for complete search history.

(56) References Cited

U.S. PATENT DOCUMENTS

| | | | | |
|---|---|---|---|---|
| 5,427,055 | A * | 6/1995 | Ichikawa | 117/92 |
| 5,484,484 | A * | 1/1996 | Yamaga et al. | 118/719 |
| 6,096,371 | A * | 8/2000 | Haaland et al. | 427/10 |
| 6,399,177 | B1 * | 6/2002 | Fonash et al. | 428/119 |
| 6,506,665 | B1 * | 1/2003 | Sato | 438/458 |

FOREIGN PATENT DOCUMENTS

JP     2003-257946 A     9/2003

* cited by examiner

*Primary Examiner*—David Nhu
(74) *Attorney, Agent, or Firm*—McDermott Will & Emery LLP

(57) ABSTRACT

The plasma etching method first forms a coating film on the inner surface of the chamber. Next, an etching process is performed on a wafer under a condition in which the coating film is formed, and thereafter a reaction product adhered onto the coating film in the etching process is removed together with the coating film. Each of these processes is implemented at a frequency in which the condition of the chamber inner surface is nearly always the same at the time of initiating the etching process.

26 Claims, 5 Drawing Sheets

PLASMA ETCHING METHOD AND PLASMA ETCHING APPARATUS

RELATED APPLICATION

This present application claims the benefit of patent application number 2005-180739, filed in Japan on Jun. 21, 2005, the subject matter of which is hereby incorporated herein by reference.

BACKGROUND OF THE INVENTION

1. Field of the Invention

The present invention relates to a plasma etching method and plasma etching apparatus, and more particularly relates to a plasma etching method and plasma etching apparatus that performs an etching process for transferring a fine pattern.

2. Description of the Related Art

In recent years, the shrinking of dimensions for transistors comprising a semiconductor integrated circuit device has made advances in response to demand for high integration, high functionality, and high speed operation in a semiconductor integrated circuit device. In conjunction with this shrinkage, transistors have been developed that provide a metal gate electrode (hereafter referred to as a metal gate) composed of metallic material such as TiN, TaN, TaSiN, or the like; and a gate insulator (hereafter referred to as high-k film) composed of a high dialectic film including a hafnium-based oxide such as $HfO_x$ and $HfSiO_x$, or the like. To manufacture a stable fine transistor that provides this type of metal gate and high-k film, a microfabrication technology is necessary that enables the gate material to be processed stably and with high precision.

The fabrication process of this type of metal gate material uses a dry etching apparatus such as a plasma etching apparatus in the same manner as the fabrication process of a gate electrode consisting of conventional polysilicon film. The etching gas used with such dry etching apparatus is a halogen-based gas such as chlorine, and etching can proceed because the metallic material reacts with the plasma of the halogen-based gas to create a metal halide.

In order to be able to process a metal gate stably and with favorable yield rate using this type of dry etching apparatus, particles which are major source of pattern defects must be reduced. In the fabrication process of the metal gate described above, the metal halide is generated at etching process and adheres to the inner surface of the chamber. An adhesiveness of the metal halide is low against the chamber inner surface and easily exfoliates from the chamber inside surface. For this reason, in order to stably fabrication of the metal gate, exfoliation of reaction product adhered to the chamber inner surface that includes the metal halide must be suppressed.

As a technology for preventing the exfoliation of the reaction product having a low adhesiveness with the chamber inner surface, Japanese unexamined patent publication No. 2003-257946 (hereafter referred to as JP2003-257946) discloses the technology in which an adhesive layer is formed on the chamber inner surface in the condition that the chamber inner surface is clean without a reaction product adhered thereon, and etching is performed on a film to be etched in the condition that the adhesive layer has been formed.

For example, with a parallel plate type plasma etching apparatus on which is mounted a wafer for etching at a lower electrode, an adhesive layer is formed at the upper electrode opposing the wafer in a clean chamber condition. Next, the etching process is performed by generating plasma of etching gas supplied passing through the upper electrode within the chamber in conjunction with the wafer being placed at the lower electrode. At this time, the reaction product reached on the upper electrode during the etching process is solidified onto the adhesive layer. In other words, the reaction product deposits in the condition having a high degree of adhesiveness onto the adhesive layer formed on the surface of the upper electrode. Therefore, the exfoliation of the reaction product becomes more difficult and the generation of particles can be suppressed.

Further, an adhesive layer is formed on the upper electrode on which the reaction product is adhered. By so doing, the exfoliation of reaction product from the upper electrode can be prevented because the reaction product already adhered to the upper electrode is interposed between the adhesive layers and the reaction product generated by the subsequent etching process is adhered onto the newly formed adhesive layer. As the result, the generation of particles can be suppressed. In other words, a lamination layer structure is formed in which an adhesive layer and a reaction product are formed (adhered) alternatively on the surface of the upper electrode opposing the wafer to be etched. In this way, the generation of the particles can be suppressed in the etching process.

SUMMARY OF THE INVENTION

The metal gate formation process, as shown for instance in FIG. 4A, first forms films on a silicon wafer 21 in order from the bottom layer of a $HfSiO_x$ film 22 and TiN film 23. On the TiN film 23, the antireflection film 24 and photoresist film are formed in that order, and the photoresist pattern 25 covered the formation area of the metal gate is formed by using photolithography.

Next, as shown in FIG. 4B, the antireflection film 24, TiN film 23, and $HfSiO_x$ film 22 are etched by the plasma etching process with resist pattern 25 as the etching mask, then. At this time, although the resist pattern 25 functions as the etching mask, the resist pattern 25 is side-etched during the etching process. Then, the gate length W2 of the metal gate 26 formed after etching is smaller in comparison to the width W1 of the gate length direction of the resist pattern 25 before etching. In addition, the resist pattern 25 and the antireflection film pattern 27 remaining on the metal gate 26 are removed by ashing process, and the formation of the metal gate is completed as shown in FIG. 4C.

In a gate length with a short gate length transistor of 50 nm or below, the difference between the resist pattern measurement W1 and the metal gate measurement W2, W1−W2 (hereafter referred to as the dimension shift) is in the same order as the gate length of the metal gate. In this case, the dimension shift must be managed to be always constant in order to realize stable transistor properties.

However, with the method disclosed in JP2003-257946 in which a reaction product generated at the time of plasma etching for a film to be etched and a new adhesive layer are adhered alternatively on the adhesive layer adhered to the chamber inner surface, the total thickness of the films adhered to the chamber inner surface increase gradually. In this case, since the condition of the plasma (plasma potential, plasma density, and the like) gradually changes over time in conjunction with the repetition of the etching process on the object to be processed, the dimension shift also changes.

FIGS. 5A and 5B show the dependence of the gate shape on the number of etching wafers under the metal gate is formed by the method disclosed in JP2003-257946. FIG. 5A shows the dependence of the dimension shift on the total number of wafers and FIG. 5B shows the dependence of the interior angle a at the bottom part of the metal gate cross-section (see FIG. 4C). From FIG. 5A, it can be understood that the dimension shift is reduced while increasing the total number of wafers and the gate length is larger with the method disclosed in JP2003-257946. Further, in FIG. 5B, it is understood that the cross-section shape of the metal gate has a width at the upper end that is a narrower shape than the width of the bottom end (a so-called over-cut shape) as a result of the interior angle a reducing while the total number of wafers increases. In other words, even though a reduction in the number of particles generated at the time of etching processing of the metal gate is possible with the method disclosed in JP2003-257946, it is insufficient technology from the perspective of stably forming a fine metal gate.

The present invention has been proposed considering the conventional situation, and its objective is to provide a plasma etching method and a plasma etching apparatus that has the ability to perform stable etching even on a fine metal gate electrode.

The present invention employs the following means in order to accomplish the aforementioned object. The plasma etching method that relates to the present invention, first forms a coating film on the inner surface of the chamber in which plasma used in an etching process is maintained. Next, an etching process is performed on an object to be processed under the condition in which the coating film is formed, and a reaction product adhered onto the coating film in the etching process is etched and removed together with the coating film. Further, each of these processes is implemented at a frequency in which the condition of the chamber inner surface is nearly always the same at the time of initiating the etching process. The fact that the condition of the chamber inner surface is nearly the same indicates that the change in the plasma condition that accompanies the change in the total thickness of the coating film and the reaction product adhered onto the coating film is in a range in which the difference in the shape after the etching process of the object to be processed is not obvious.

According to this composition, the removal of the coating film is, for instance, performed every time in the etching process of an object to be processed, enabling the etching process to be performed with the internal chamber always in the same condition. Therefore, stable processing can be performed with favorable fabrication even with an etching process that forms a fine pattern.

The coating film preferably contains, for instance, a constituent element of the object to be processed on which etching is performed immediately after the formation of the coating film. Especially, in the case that the object to be processed contains a metal element, the coating film preferably contains such metal element. Therefore, the reaction product generated during the etching process adheres to the coating film in the condition of high adhesiveness, and the generation of particles can be suppressed in.

Further, the formation of the coating film is preferably performed by using a sputtering method and chemical vapor deposition method that can be executed as a series of processes with the etching process in order to avoid a significant reduction in the throughput of the etching process.

Meanwhile, from another perspective, the present invention can provide a plasma etching apparatus favorable for implementation with aforementioned plasma etching method. In other words, the plasma etching apparatus that relates to the present invention comprises a coating film formation unit for forming a coating film on the chamber inner surface, a first gas supply unit for supplying into the chamber process gas used in the etching process of an object to be processed, and a second gas supply unit for supplying the chamber process gas used in the removal of the coating film.

Further, After the etching process that used the process gas supplied by the first gas supply unit is completed under the coating film is formed, the second gas supply unit supplies the process gas and the reaction product adhered onto the coating film is removed together with the coating film in the etching process.

With the present invention, a coating film is formed to the chamber inner surface prior to the etching process on the object to be processed, and the reaction product adhered by arriving onto the inner surface of the chamber in the etching process is removed together with the coating film after the etching process. In other words, when the etching process is initiated, a coating film formed as a film under the same conditions exists on the inner surface of the chamber, and the condition of the chamber inner surface can always be reproduced to the same. Therefore, the plasma potential and plasma density of the plasma used in the etching process for the object to be processed is in the same condition, and it is possible to perform a stable process with high reproducibility even for the etching process for forming a fine pattern.

In addition, by adopting a film which is superior in adhesion for the reaction product generated during the etching process, the reaction product is not only easily adhered onto the chamber inner surface, but the exfoliation of the reaction product adhered onto the coating film is also suppressed. Consequently, the generation of particles, caused by tiny suspended particles in the chamber and the exfoliation of the reaction product that is adhered onto the inner surface of the chamber, can be suppressed.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
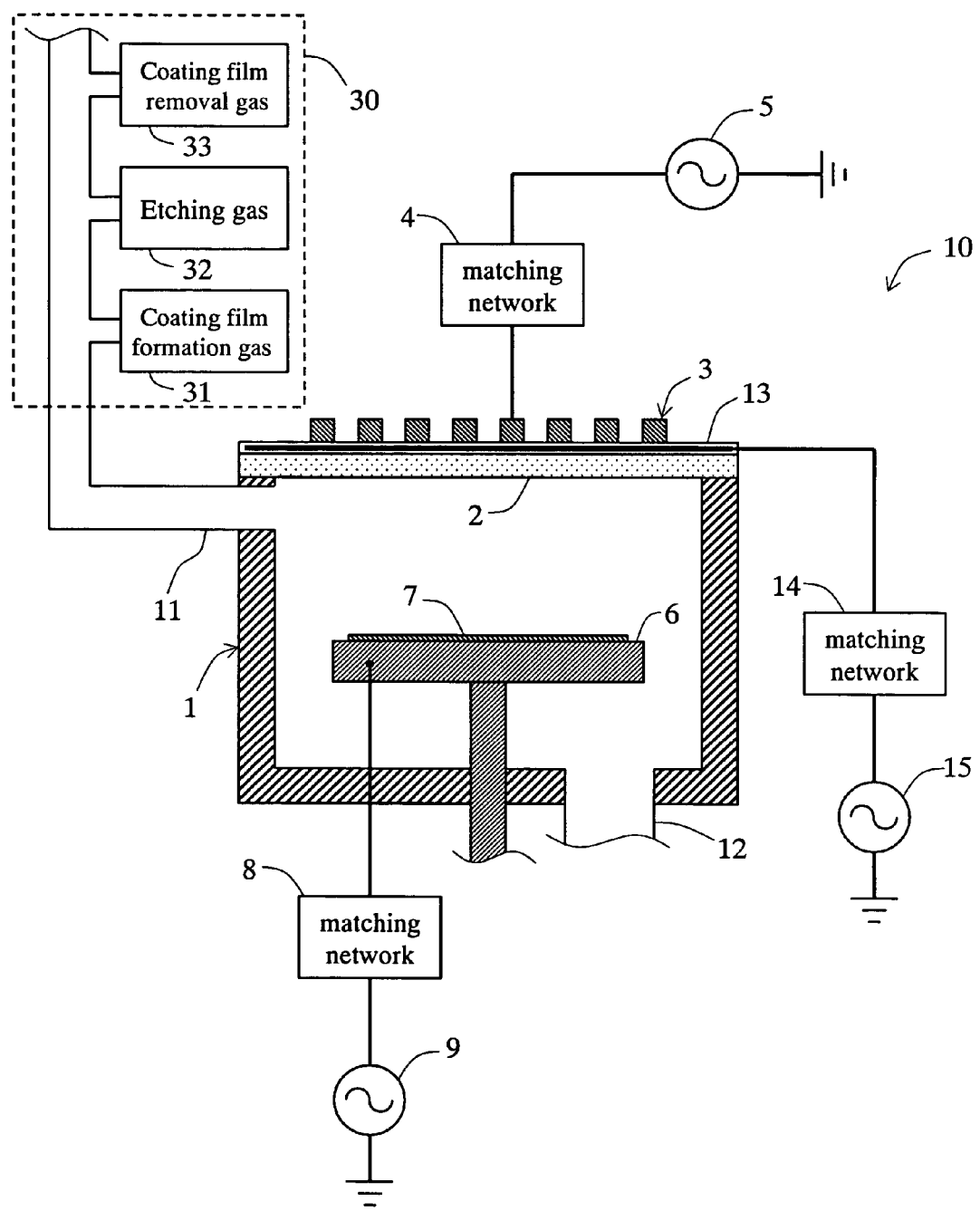
FIG. 1 is a schematic diagram showing a plasma etching apparatus that relates to an embodiment of the present invention.
Figure 2:
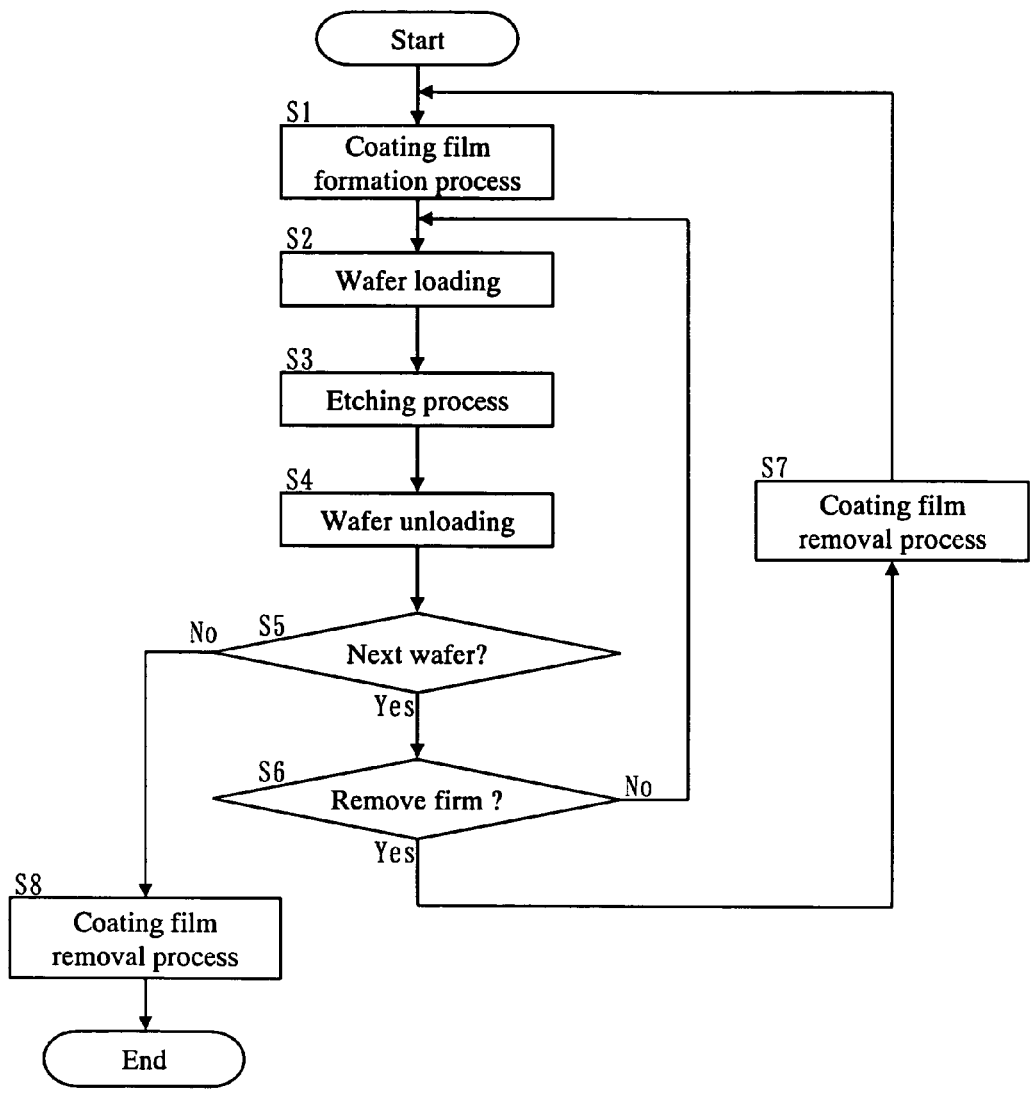
FIG. 2 is a flow diagram showing the process of a plasma etching method that relates to an embodiment of the present invention.

A detailed description is provided hereafter of an embodiment of the present invention with reference to drawings. FIG. 1 is a schematic cross-sectional view of a plasma etching apparatus that relates to the present embodiment. FIG. 2 is a flow diagram of the process of the plasma etching method that relates to the present embodiment.

As shown in FIG. 1, a plasma etching apparatus 10 of the present embodiment comprises a chamber 1 of nearly cylindrical shape having an axis in the vertical direction. The upper wall of the chamber 1 is constructed from, for instance, a plate-shaped dielectric wall 2 consisting of a dielectric material such as quarts, and a flat coil 3 is provided at the upper surface of the dielectric wall 2. A high-frequency power source 5 to output high-frequency power, for instance, at the frequency of 13.56 MHz, is connected to the flat coil 3 via an impedance matching network 4.

The flat coil 3 is an electrically unified coil which is constructed in, for instance, a whorl-shape or nearly concentric circle shape. When the RF power is applied from the high-frequency power source 5, the flat coil 3 generates a magnetic field where electrons have a nearly circular motion by making the axis of the chamber 1 to be the center of axis within the face perpendicular to the axial direction of the chamber 1. In addition, the side wall and lower wall of the chamber 1 are constructed from aluminum in the present embodiment, and a film having a corrosion resistance is formed by anodization on at least the inner surface of the aluminum.

Meanwhile, a stage 6 where a wafer 7 is placed to be the object of etching, is provided at the opposing position to the dielectric wall 2 in the chamber 1. A high-frequency power source 9 to output high-frequency power, for instance, at the frequency of 13.56 MHz is connected to the stage 6 via an impedance matching network 8.

Further, a plate-shaped Faraday shield electrode 13 is provided between the flat coil 3 and the dielectric wall 2. A high-frequency power source 15 to output high-frequency power, for instance, at the frequency of 13.56 MHz is connected to the Faraday shield electrode 13 via an impedance matching network 14. The Faraday shield electrode 13 has a feature to regulate the quantity of injected ion which enters the dielectric wall 2 after being created in plasma by shifting the relative electrical potential of the dielectric wall 2 in relation to plasma created in the chamber 1.

In addition, the impedance matching networks 4, 8, and 14 are adjusted to a matching state in which the loss of the high-frequency power applied by each of the high-frequency power sources 5, 9, and 15 is minimized in accordance with the impedance object to the high-frequency power application which fluctuates with the creation of plasma by the electrical power supplied from each of the high-frequency power sources 5, 9, and 15.

Furthermore, a gas feed port 11, where the process gas supplied from a gas supply unit 30 is introduced, is provided to the upper sidewall of the chamber 1; and a gas exhaust port 12, where the vacuum pump to keep the inside of the chamber 1 in the prescribed pressure is connected, is provided to the lower part of the chamber 1. In addition, the wafer 7 placed on the stage 6 is loaded and unloaded from the chamber 1 via an inlet/outlet port, which is not illustrated, provided at the sidewall of the chamber 1 with the ability to open and close.

When an etching process is performed with the plasma etching apparatus 10, a coating film is formed first at the inner surface of the chamber 1 (FIG. 2 S1). Preferably, this coating film contains a constituent element of an etching film in which the etching process is performed later on. For instance, in the case teat a $HfSiO_x$ film 22, TiN film 23, and antireflection film 24 are formed in order from the bottom illustrated by the examples in FIGS. 4A to 4C, and the etching process is performed to a resist pattern 25 as an etching mask, a film containing titanium such as titanium film and titanium nitride film, and a film containing tantalum such as tantalum film and tantalum nitride film can be adopted as the coating film.

Figure 4A:
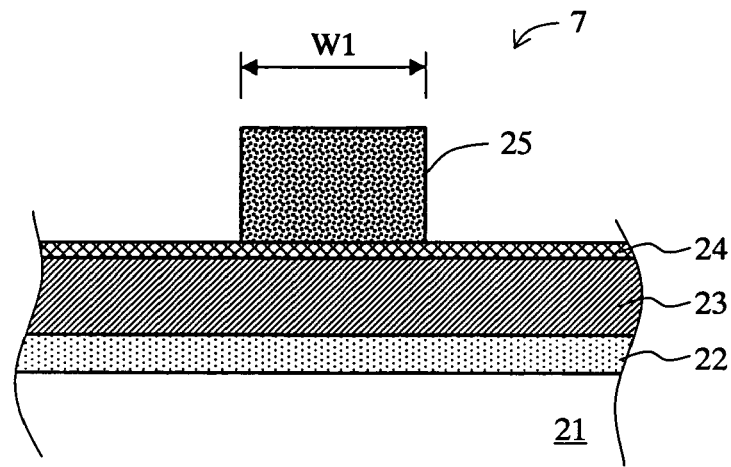
FIGS. 4A to 4C are cross sectional views showing a laminated structure of the metal gate.

In the etching process of a multilayer film having the laminated structure shown in FIG. 4A, the metal halide ($TiCl_4$) which is the reaction product generated at the time of the etching process of TiN film 23 has the lowest adhesion to the inner surface of the chamber 1. Consequently, the adhesion of the metal halide can be improved by forming a film containing titanium as the coating film. By so doing, the reaction product becomes easier to adhere to the inner surface of the chamber 1, and the reaction product that has adhered on the coating film is suppressed from exfoliating. As a result, the generation of particles, caused by tiny suspended particles in the chamber, and the exfoliation of the reaction product that is adhered onto the inner surface of the chamber, can be suppressed.

Such film formation containing titanium can be achieved by placing a substrate composed of, for instance, Ti or TiN at the stage 6, and performing sputter etching onto the substrate. Such sputter etching is possible to be implemented by introducing argon gas at a flow rate of 10 sccm into chamber 1 by the coating film formation gas supply unit 31 (coating film formation unit), and at the same time, maintaining the pressure inside chamber 1 at about 10 Pa, and applying the electrical power to the stage 6 by the high-frequency power source 9. At that time, the high-frequency power (at the frequency of 13.56 MHz) applied by the high-frequency power source 9 is 500 W. Further, the temperature of the stage 6 in this process is maintained at about 70° C. by a non-illustrated heater housed in the stage 6.

In addition, because the coating film is removed after the etching process as described hereafter, the thickness of the coating film is preferably as thin as possible in the range that the inner surface of the chamber 1 can be coated so as to be easily removed. For instance, if the irregularities of the inner surface of the chamber 1 are a few micrometers, the thickness of the coating film may be about 10 nm. Furthermore, the titanium contained film may be formed by performing the plasma enhanced chemical vapor deposition in the chamber 1 to, for example, $TiCl_4$ gas supplied from the coating film formation gas supply unit 31 without limiting the film formation method.

When the formation of the coating film on the inner surface of the chamber 1 is completed as described above, the wafer used for the formation of the coating film is unloaded from the chamber 1. Subsequently, the wafer 7 that is the object to be processed is loaded into the chamber 1, and the etching process (FIG. 2 S2 to S3) is performed by using the gas supplied from the etching gas supply unit 32 (first gas supply unit). In the case of the construction illustrated by the example in FIG. 4A, etching is performed first to the antireflection film 24 by using the resist pattern 25 as an etching mask.

For instance, in the case teat the antireflection film 24 is composed of organic material, the etching can be performed by introducing a flow rate of 90 sccm of $SO_2$ gas, and 10 sccm of $O_2$ gas into the chamber 1, and at the same time, maintaining the pressure inside the chamber 1 at about 0.5 Pa, and applying the electrical power to the flat coil 3 by the high-frequency power source 5 and to the stage 6 by the high-frequency power source 9. At the time, the high-frequency power (at the frequency of 13.56 MHz) applied by the high-frequency power source 5 is 1000 W, and the high-frequency power (at the frequency of 13.56 MHz) applied by the high-frequency power source 9 is 100 W. Further, the temperature of the stage 6 is maintained at about 20° C.

When the etching of the antireflection film 24 is completed, the application of the high-frequency power from the high-frequency power sources 5 and 9 is stopped and gas is exhausted once from the interior of the chamber 1. Subsequently, the TiN film 23 comprising the material of the metal gate is etched by using the resist pattern 25 as an etching mask.

In the etching, for instance, the flow rate of 90 sccm of the $BCl_3$ gas and 10 sccm of the $Cl_2$ gas are introduced into the chamber 1, the pressure inside the chamber 1 is maintained at about 0.5 Pa, and the high-frequency power source 5 applies the electrical power to the flat coil 3 and the high-frequency power source 9 applies the electrical power to the stage 6. At that time, the high-frequency power source 5 applies the high-frequency power (at the frequency of 13.56 MHz) of 1500 W to the flat coil 3, and the high-frequency power source 9 applies the high-frequency power (at the frequency of 13.56 MHz) of 150 W to the stage 6. In addition, the temperature of the stage 6 is maintained at about 50° C.

The reaction product that is generated in the etching process as described above adheres and accumulates on the coating film at the time that reaction product has reached the inner surface of the chamber 1. In the case that the coating film is the film containing titanium as described above, the metal halide (in this case, titanium chloride) that is generated in the process of the etching process of the TiN film is easily accumulated on the coating film in the condition having the higher adhesion compared to when having no coating film.

When the etching process is completed as described above, the application of the electrical power from the high-frequency power resources 5 and 9 is stopped, and the wafer 7 in which the etching process is completed is unloaded from the chamber 1 via the inlet/outlet port which is not illustrated (FIG. 2 S4).

After the wafer 7 is unloaded, if there is a wafer to be processed next, the process to remove the coating film of the inner surface of the chamber 1 is performed (FIG. 2 S5Yes to S6Yes to S7). Here, an explanation is given in regards to a case in which the coating film is removed each time a piece of the wafer 7 is etched. However, in the case that there are fewer reaction products generated in the etching process, and the condition of the inner surface of the chamber 1 does not show much change after a piece of the wafer 7 is etched, the etching process may be performed to the next wafer without removing the coating film (FIG. 2 S6No to S1).

The removal of coating film can be achieved by plasma etching which uses the gas supplied from a coating film removal gas supply unit 33 (second gas supply unit). The etching to remove the coating film in the above case can be achieved by introducing the $Cl_2$ gas at a flow rate of 300 sccm, $O_2$ gas at a flow rate of 20 sccm into the chamber 1, and applying the electrical power to the flat coil 3 by the high-frequency power source 5, and to the Faraday shield electrode 13 by the high-frequency power source 15. At the time, the high-frequency power source 5 applies the high-frequency power of 100W (at the frequency of 13.56 MHz) to the flat coil 3 and the high-frequency power source 15 applies the high-frequency power of 500 W (at the frequency of 13.56 MHz) to the Faraday shield electrode 13. In addition, the temperature of the stage 6 is maintained at about 70° C. at the time.

According to the etching condition, the electrical potential difference between the plasma and the dielectric wall 2 increases by the high-frequency power applied to the Faraday shield electrode 13. Consequently, the quantity of injected ion into the plasma to the dielectric wall 2 increases, and the reaction product accumulated on the coating film and the coating film on the dielectric wall 2 can be removed effectively.

Further, when the removal of reaction product accumulated on the coating film and the coating film on the inner surface of the chamber 1 is completed, the coating film is formed again, and the wafer 7 can be etched (FIG. 2 S1 to S2).

When the etching process is completed on all wafers as described above, the process completes after removing the coating film (FIG. 2 S5No to S8).

Figure 3A:
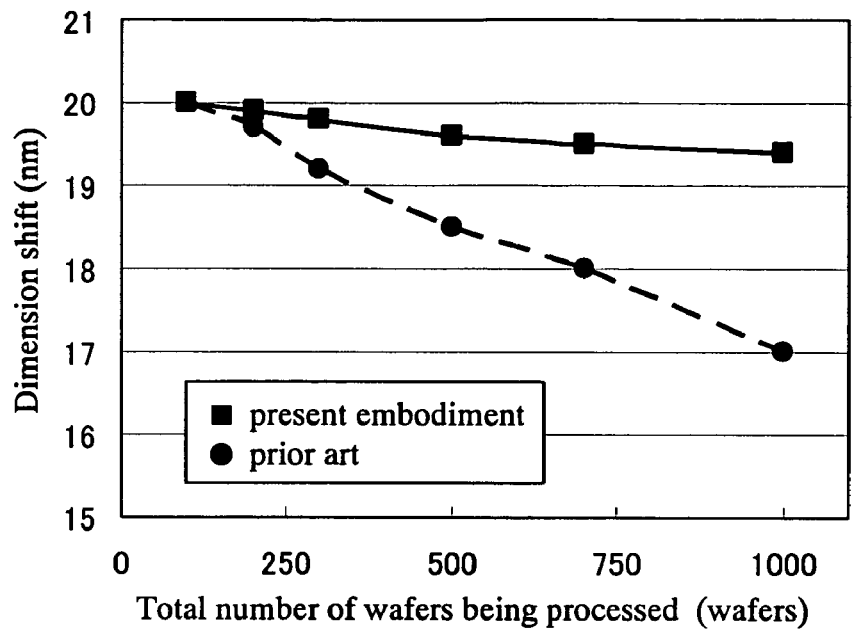
FIGS. 3A and 3B are drawings showing the dependence of the pattern shape on the total number of wafer being processed in a plasma etching method that relates to an embodiment of the present invention.
Figure 3B:
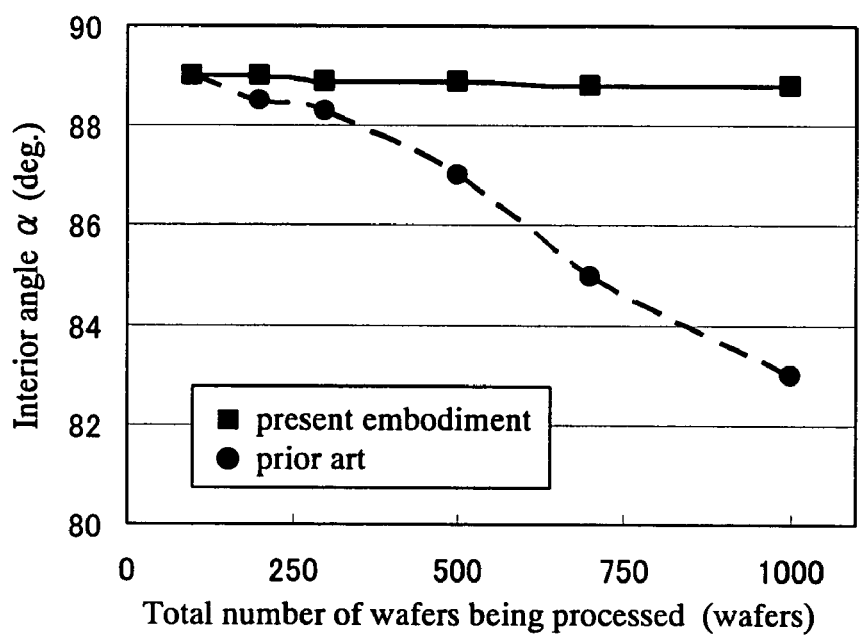
Figure 4B:
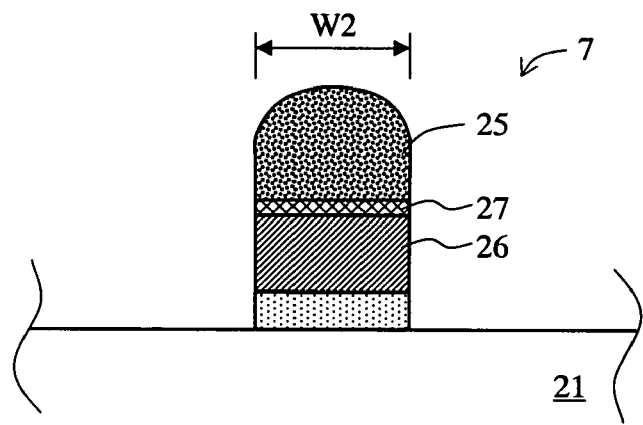
Figure 4C:
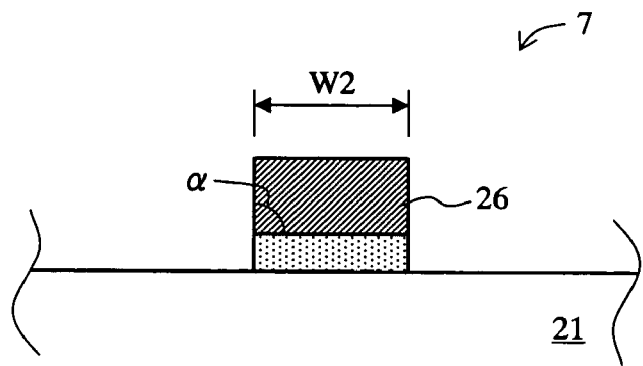
Figure 5A:
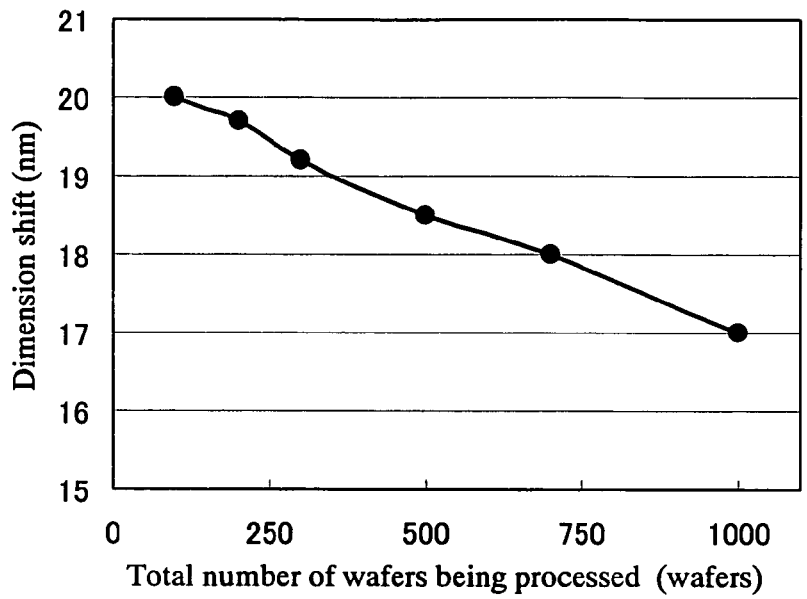
FIGS. 5A and 5B are drawings showing the dependence of the pattern shape on the total number of wafer being processed in a conventional plasma etching method.
Figure 5B:
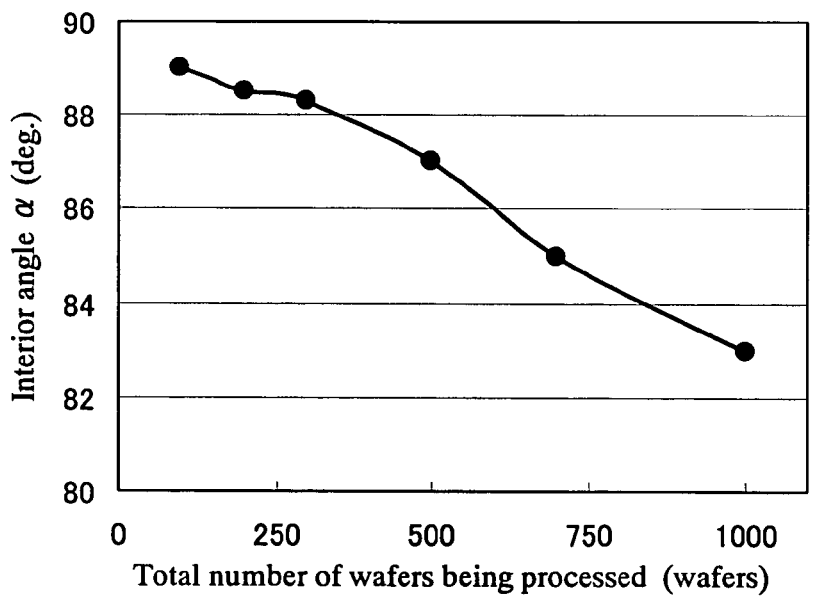

FIGS. 3A and 3B show the dependence of the metal gate shape on the number of wafers in the case of accumulation processing of when the etching process is performed as shown in the examples of FIGS. 4A to 4C. The lateral axis corresponds to the total number of wafers in FIGS. 3A and 3B. Further, the vertical axis corresponds to the dimension shift value as described above in FIG. 3A. Furthermore, the vertical axis corresponds to the interior angle a (refer to FIG. 4C) of the bottom section of the metal gate cross-section profile in FIG. 3B. Moreover, the data shown by the examples in FIGS. 5A and 5B is indicated by a dashed line as a comparative example.

As can be understood from FIG. 3A, even when the total number of wafers being processed reaches 1000, the dimension shift value is suppressed below 1 nm, and a stable etching process with high reproducibly is realized according to the method of the present embodiment. Further, it also can be understood that even when the total number of wafers being processed reaches to 1000, the shape of the cross-section of the metal gate becomes the favorable shape of nearly rectangular and not becoming as the over cut shape as in conventional method.

For that matter, a favorable result also is obtained even when the total number of wafers being processed reaches to 7000, the dimension shift value is constantly suppressed below 1 nm, and the interior angle a also maintained constantly at 89.0 degrees.

As described above, according to the present embodiment, when the etching process (FIG. 2 S2 to S4) is initiated, the identical coating film is formed on the inner surface of the chamber 1. In other word, the inner surface of the chamber 1 is constantly in the same condition when the etching process is initiated. Consequently, the condition of plasma used for the etching process is also the same. Accordingly, the dependence of the dimension shift on the total number of wafers described above can be eliminated, and an extremely stable etching process with high reproducibility can be realized.

In addition, the present invention is not limited to the embodiment described above, and various modifications and applications are possible in the range which can prove the effect of the present invention. The embodiment having the function so as to improve the adhesion of the reaction product to the coating film is described above as the preferred embodiment. However, if a quality of material can adhere to the reaction product, a coating film composed of any material, for instance silicon dioxide film and the like, can be used.

Further, $Cl_2$ gas is used in the above as the etching gas to remove the coating film with the adhered reaction product. However, any gas which can remove the coating film may be used as the etching gas. For instance, a similar effect can be obtained by using $SF_6$ gas.

Furthermore, the case example in which the material of the metal gate is TiN film is explained in the above description. However, a similar effect can be obtained by using other materials such as TaN film and the like.

Moreover, the inductively coupled plasma etching apparatus comprising the Faraday shield electrode is explained as the plasma etching apparatus in the above description. However, it is needless to say that the present invention can be applied to any type of plasma etching apparatuses.

The present invention is capable of performing stable etching process with high accuracy for forming a fine pattern such as the metal gate, so it is very useful for dry etching process.

While the invention has been described in detail, the foregoing description is in all aspects illustrative and not restrictive. It is understood that numerous other modifications and variations can be devised without departing from the scope of the invention.

The invention claimed is:

1. A plasma etching method of performing an etching process on an object to be processed by the plasma that is maintained in a chamber, comprising:
   forming a coating film on an inner surface of the chamber;
   etching an object to be processed using the plasma in the chamber having the coating film formed in the coating film forming step;
   removing the coating film together with a reaction product from the inner surface of the chamber, the reaction product being generated and adhered onto the coating film in the plasma etching step.

2. The plasma etching method according to claim 1, wherein the coating film forming step is done so that the coating film contains a constituent element of the object to be processed.

3. The plasma etching method according to claim 2, wherein the constituent element of the object to be processed is a metal element.

4. The plasma etching method according to claim 2, wherein the coating film forming step includes a sputter etching of a substrate composed of the constituent element of the coating film in the chamber.

5. The plasma etching method according to claim 3, wherein the coating film forming step includes a sputter etching of a substrate composed of the constituent element of the coating film in the chamber.

6. The plasma etching method according to claim 2, wherein the coating film forming step includes a chemical vapor deposition (CVD) of the constituent element of the coating film in the chamber.

7. The plasma etching method according to claim 3, wherein the coating film forming step includes a chemical vapor deposition (CVD) of the constituent element of the coating film in the chamber.

8. The plasma etching method according to claim 1, wherein the coating film removing step is performed each time the etching step for the one object to be processed is completed.

9. The plasma etching method according to claim 2, wherein the coating film removing step is performed each time the etching step for the one object to be processed is completed.

10. The plasma etching method according to claim 3, wherein the coating film removing step is performed each time the etching step for the one object to be processed is completed.

11. The plasma etching method according to claim 4, wherein the coating film removing step is performed each time the etching step for the one object to be processed is completed.

12. The plasma etching method according to claim 5, wherein the coating film removing step is performed each time the etching step for the one object to be processed is completed.

13. The plasma etching method according to claim 6, wherein the coating film removing step is performed each time the etching step for the one object to be processed is completed.

14. The plasma etching method according to claim 7, wherein the coating film removal step is performed each time the etching step for the one object to be processed is completed.

15. A plasma etching method of performing an etching process on an object to be processed by the plasma that is maintained in a chamber, the object to be processed comprising a metal film formed on a silicon substrate via a gate insulator and a photoresist pattern formed on the metal film, the comprising:
    forming a coating film on an inner surface of the chamber, the coating film containing a metal element which constitutes the metal film;
    forming a gate electrode consisting of the metal film by etching the metal film using the plasma with the photoresist pattern as a mask in the chamber having the coating film formed in the coating film forming step;
    removing the coating film together with a reaction product from the inner surface of the chamber, the reaction product being generated and adhered onto the coating film in the plasma etching step.

16. The plasma etching method according to claim 15, wherein the coating film forming step includes a sputter etching of a substrate composed of the metal element of the metal film in the chamber.

17. The plasma etching method according to claim 15, wherein the coating film forming step includes a chemical vapor deposition (CVD) of the metal element of the metal film in the chamber.

18. The plasma etching method according to claim 15, wherein the coating film removing step is performed each time the gate electrode forming step for the one object to be processed is completed.

19. The plasma etching method according to claim 15, wherein the gate insulator is a dielectric film including a hafnium-based oxide.

20. The plasma etching method according to claim 16, wherein the gate insulator is a dielectric film including a hafnium-based oxide.

21. The plasma etching method according to claim 17, wherein the gate insulator is a dielectric film including a hafnium-based oxide.

22. The plasma etching method according to claim 18, wherein the gate insulator is a dielectric film including a hafnium-based oxide.

23. The plasma etching method according to claim 19, wherein the metal film contains at least one of TiN, TaN, and TaSiN.

24. The plasma etching method according to claim 20, wherein the metal film contains at least one of TiN, TaN, and TaSiN.

25. The plasma etching method according to claim 21, wherein the metal film contains at least one of TiN, TaN, and TaSiN.

26. The plasma etching method according to claim 22, wherein the metal film contains at least one of TiN, TaN, and TaSiN.

* * * * *